United States Patent
Coimbra et al.

(10) Patent No.: US 9,310,261 B2
(45) Date of Patent: Apr. 12, 2016

(54) PRODUCTION-TEST DIE TEMPERATURE MEASUREMENT METHOD AND APPARATUS

(71) Applicant: FREESCALE SEMICONDUCTOR, INC., Austin, TX (US)

(72) Inventors: Ricardo P. Coimbra, Campinas (BR); Edevaldo Pereira Da Silva, Jr., Campinas (BR); Pedro B. Zanetta, Campinas (BR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/641,037

(22) Filed: Mar. 6, 2015

(65) Prior Publication Data

US 2015/0177075 A1 Jun. 25, 2015

Related U.S. Application Data

(62) Division of application No. 13/663,991, filed on Oct. 30, 2012, now Pat. No. 9,074,943.

(51) Int. Cl.
*G01K 7/00* (2006.01)
*G01K 7/01* (2006.01)
*G01R 31/28* (2006.01)

(52) U.S. Cl.
CPC ............ *G01K 7/015* (2013.01); *G01R 31/2874* (2013.01); *G01R 31/2856* (2013.01)

(58) Field of Classification Search
USPC ............................ 374/178, 170, 171; 327/512
See application file for complete search history.

(56) References Cited

U.S. PATENT DOCUMENTS

| | | | |
|---|---|---|---|
| 5,195,827 A | | 3/1993 | Audy et al. |
| 5,982,021 A | * | 11/1999 | Verma ........................... 257/577 |
| 7,010,440 B1 | * | 3/2006 | Lillis et al. ...................... 702/65 |
| 7,279,954 B2 | * | 10/2007 | Throngnumchai et al. ... 327/512 |
| 7,461,974 B1 | * | 12/2008 | Aslan et al. .................... 374/178 |
| 7,674,035 B2 | | 3/2010 | Pertijs et al. |
| 2002/0140447 A1 | | 10/2002 | Throngnumchai et al. |
| 2007/0001744 A1 | | 1/2007 | Miranda et al. |
| 2008/0069176 A1 | | 3/2008 | Pertijs |
| 2008/0144415 A1 | | 6/2008 | Macerola et al. |

(Continued)

OTHER PUBLICATIONS

Pertijs, Michael A. P. et al.; "Transistor Temperature Measurement for Calibration of Integrated Temperature Sensors" IEEE Instrumentation and Measurement Technology Conference, Anchorage, AK, USA; May 21-23, 2001; pp. 755-758; IEEE.

*Primary Examiner* — Mirellys Jagan

(57) ABSTRACT

A die temperature measurement system (300) includes an external test environment setup (352) and an integrated circuit (302). The external test environment setup (352) includes means to force and accurately measure electrical variables. The integrated circuit (302) includes a bipolar transistor (325); a selectable switch (340) for selecting from plurality of integrated resistances (342, 344) to be coupled in series between a base (322) of the bipolar transistor and a first input (362); and a selectable-gain current mirror (310) with a gain, a programmable current-mirror output coupled to the collector (326) of the bipolar transistor. The bipolar transistor and optional diodes (335) are sequentially biased with a set of proportional collector current levels. For each bias condition, the temperature-dependent voltage produced by the structure is extracted and stored. Die temperature is obtained through algebraic manipulation (450) of this data. Parasitic resistance and I/O pad leakage effects are canceled.

12 Claims, 5 Drawing Sheets

(56) References Cited

U.S. PATENT DOCUMENTS

| | | | |
|---|---|---|---|
| 2010/0264980 A1* | 10/2010 | Arguello | ............ 327/513 |
| 2010/0329304 A1 | 12/2010 | Doorenbos | |
| 2011/0096809 A1 | 4/2011 | Campos et al. | |
| 2011/0221931 A1 | 9/2011 | Wakabayashi et al. | |
| 2012/0133422 A1 | 5/2012 | Pereira da Silva, Jr. et al. | |

\* cited by examiner

PRODUCTION-TEST DIE TEMPERATURE MEASUREMENT METHOD AND APPARATUS

CROSS-REFERENCE TO RELATED APPLICATION(S)

The present application is a divisional of U.S. patent application Ser. No. 13/663,991, entitled "PRODUCTION-TEST DIE TEMPERATURE MEASUREMENT" filed on Oct. 30, 2012, the entirety of which is herein incorporated by reference.

BACKGROUND

1. Field

This invention relates generally to measuring die temperature during experimental characterization of integrated circuits, and more specifically during factory testing of System-on-Chip (SoC) products.

2. Related Art

The operating characteristics of integrated circuits are commonly temperature dependent. It is generally required to characterize, validate, and/or calibrate a set of product specifications in respect to the die temperature. This requires some procedure to measure die temperature during test with appropriate accuracy.

To perform validation and calibration of products with high-precision temperature-related specifications, a highly-accurate method to measure die temperature is needed. Solutions based on external temperature sensors, such as thermocouples, commonly provide poor measurement accuracy of die temperature, typically worse than ±7° C. This is mainly due to the significant thermal gradient between the measurement point of interest (silicon junction) and the sensor locus (outside package). This error is higher on System-on-Chip (SoC) products with high power dissipation. Solutions based on fully integrated temperature sensors are not sensitive to thermal gradients beyond the silicon interface, but are commonly limited by the complexity of the measurement and signal-conditioning circuitry that may be completely integrated. Another factor that compromises the precision of internal temperature sensors is that their output is commonly accessible through a pad that is subject to leakage effect. Leakage currents will create signal offsets that result in measurement errors. In integrated circuits, the pads are small areas of metal, typically copper or a copper alloy, in predetermined shapes normally used to make a connection to a component pin. The pad leakage is often a limitation to signal measurement precision, especially at high temperatures, turning production-testing at elevated die temperatures a particularly challenging task.

BRIEF DESCRIPTION OF THE DRAWINGS

Embodiments of the present disclosure are illustrated by way of example and the present disclosure is not limited by the accompanying figures, in which like references indicate similar elements. Elements in the figures are illustrated for simplicity and clarity and have not necessarily been drawn to scale.

DETAILED DESCRIPTION

Figure 1:
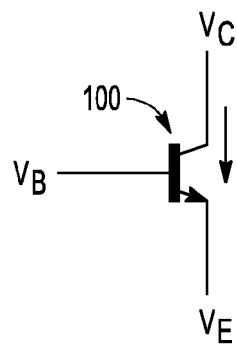
FIG. 1 is a diagram of a bipolar transistor illustrating the voltage applied to three regions, a collector region, a base region, and an emitter region.

Any benefits, advantages or solutions to problems described herein with regard to specific examples are not intended to be construed as a critical, required or essential feature or element of any or all the claims. Unless stated otherwise, terms such as "first" and "second" are used to arbitrarily distinguish between the elements such terms describe. Thus, these terms are not necessarily intended to indicate temporal or other prioritization of such elements. The term "coupled," as used herein, is defined as "connected," and encompasses the coupling of devices that may be physically, electrically or communicatively connected (according to context), although the coupling may not necessarily be directly, and not necessarily be mechanically. The term "configured to" describes hardware, software or a combination of hardware and software that is adapted to, set up, arranged, built, composed, constructed, designed or that has any combination of these characteristics to carry out a given function. The term "adapted to" describes hardware, software or a combination of hardware and software that is capable of, able to accommodate, to make, or that is suitable to carry out a given function. The abbreviation I/O is being used to mean "input/output", such as an I/O pad to the circuit.

Die temperature is sensed using an integrated temperature sensing structure. The integrated temperature sensing structure is placed at a point of interest (i.e., a silicon junction) and is insensitive to thermal gradients between silicon and external medium. The integrated temperature sensing structure relies on external test instrumentation to perform highly accurate signal conditioning and measurement. Therefore, the integrated temperature sensing structure does not require any complex processing circuitry, and exploits the fact that external test instrumentation commonly provides much higher accuracy than is possible through fully integrated test circuitry. The elimination of any complex processing circuitry also favors a low silicon area usage which minimizes cost. Methods in accordance with the present disclosure include techniques to eliminate main sources of error related to die temperature measurement.

Embodiments of sensors and methods disclosed herein measure die temperature with very high precision during factory test. Unlike other solutions that rely on fully internal (integrated) reference thermal sensors, embodiments disclosed herein eliminate the need for high-performance signal conditioning being done internally to the integrated circuit. Rather, the high-performance signal conditioning is done by external test instrumentation commonly used during factory test. Unlike other solutions that employ fully external thermal sensors, embodiments disclosed herein has the sensing element internal to the integrated circuit therefore achieving better match between temperature measured and the actual temperature of interest.

Embodiments of the sensors and methods disclosed herein improve the accuracy of die temperature measurements. This improved accuracy enables product designs to be validated and tested. Products can also achieve more accurate calibration to support high-precision temperature-related specifications.

Embodiments of the sensors and methods disclosed herein employ bipolar transistors as die-temperature sensing structures. It is possible to determine the junction temperature by exciting a sequence of input signals to a bipolar transistor, observing the temperature-dependent output signals, and calculating the temperature from the relationship between these signals. FIG. 1 is an example diagram of a bipolar transistor. Shown is a voltage $V_B$ applied at a base, a voltage $V_C$ applied to a collector, and a voltage $V_E$ applied at an emitter.

Figure 2:
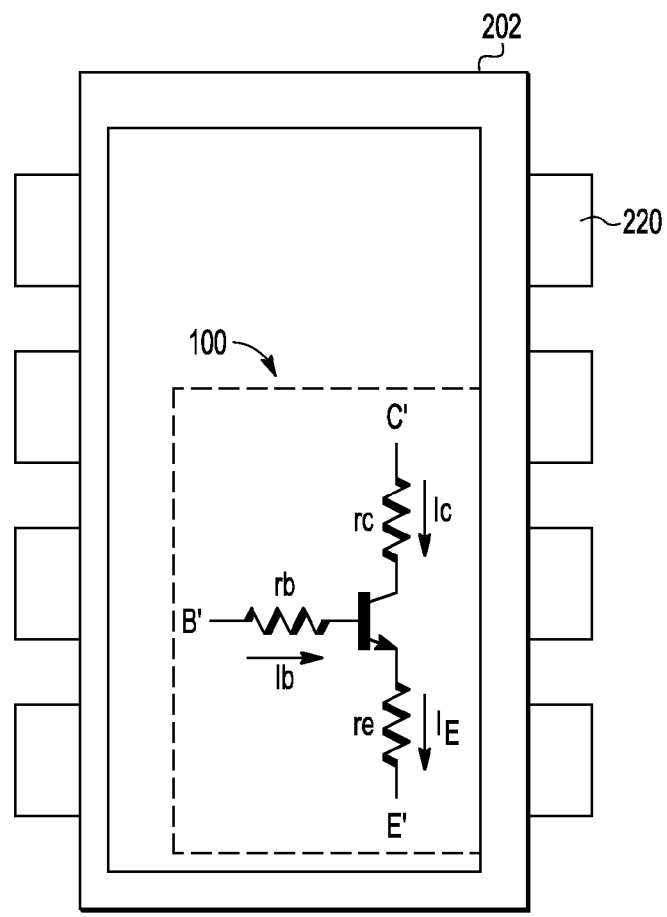
FIG. 2 is a diagram of the bipolar transistor of FIG. 1 being used as a temperature sensor within an integrated chip.

Continuing further, FIG. 2 is a diagram of the bipolar transistor of FIG. 1 being used a temperature sensing element within an integrated circuit 202. Shown are the currents and the parasitic resistances for the collector, the base and the emitter along with eight I/O pads 220. Parasitic resistance is a resistance encountered in a circuit board or integrated circuit but not included in the original design. The parasitic resistance is typically an undesirable, unintended consequence of putting a design into manufacturing. The value of parasitic resistance can be estimated in order to make sure the circuit still functions as designed. One example of a parasitic resistance is the resistance of a transistor or a resistance of a diode. Another example of parasitic resistance is the resistance of the traces in a circuit board or metal interconnects in an integrated circuit (IC), the purpose of which is to connect components electrically according to the circuit diagram, but these connecting structures are not ideal.

The parasitic resistances of the bipolar transistor are $r_C$, $r_B$ and $r_E$, which correspond to the collector parasitic resistance, the base parasitic resistance, and the emitter parasitic resistance, respectively. The parasitic resistances $r_C$, $r_B$ and $r_E$ of the bipolar transistor typically include a routing resistance, as well. Also shown are the current flowing into the collector $I_C$, the current flowing into the base $I_B$, and the current flowing out of the emitter $I_E$.

The junction temperature can be determined through the change in emitter-base voltage of a bipolar transistor in response to a change in collector current density:

$$\Delta V_{BE} = V_{BE1} - V_{BE2} = \frac{kT}{q} \ln \frac{I_{C1}}{I_{C2}} => T = \Delta V_{BE} \cdot \frac{q}{k} \cdot \frac{1}{\ln \frac{I_{C1}}{I_{C2}}} \quad \text{(Equation 1)}$$

where $V_{BE}$ is the forward-bias voltage between the base and the emitter at two different successive time intervals, i.e., "1" and "2" ($V_{BE1}$, $V_{BE2}$), k is Boltzmann's constant, q is the electron charge, T is the absolute temperature measured in kelvin, ln is the natural logarithm function, $I_{C1}$ $I_{C1}$ is the collector current at the first time interval, and $I_{C2}$ is the collector current at the second time interval.

However, a method to extract die temperature based on Equation 1 must be refined to avoid potential error sources. The measure of bipolar terminal voltages is subject to the effect of current flowing through terminal resistances or other parasitic resistances which contribute with offset (error) components. Also, the measurement being made at a pin of the integrated circuit is subject to the effect of leakage currents, mainly from reverse-biased junctions at the I/O pad 220, which are especially problematic at higher temperatures. Finally, there is a weak dependence of Equation 1 with process technology which is commonly captured by a process model parameter called non-ideality factor. The present disclosure addresses each of these potential error sources in order to provide optimum accuracy.

Figure 3:
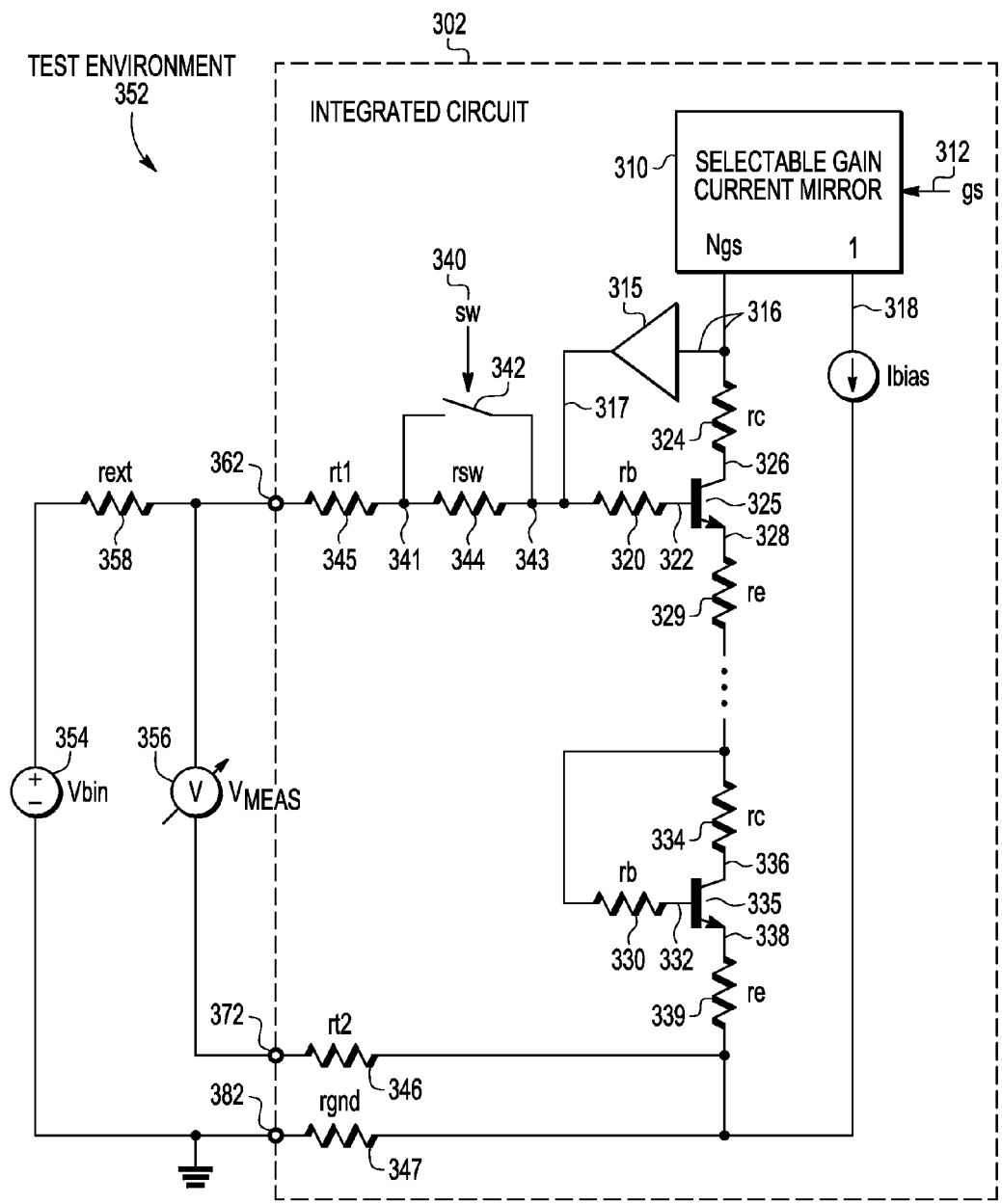
FIG. 3 is a schematic diagram of an embodiment of a die temperature measurement system with pad leakage cancellation.

FIG. 3 is an example schematic diagram of an embodiment of a die temperature measurement system 300 with pad leakage cancellation. The die temperature measurement system 300 is divided into two major sections, an external test environment 352 and the integrated circuit 302. The test environment 352 is now described. An external voltage $V_{BIN}$ 354 is applied between a first I/O pad 362 and a third I/O pad 382 of the integrated circuit 302. Also, the external voltage $V_{BIN}$ 354 is applied to an external resistance $r_{ext}$ 358 coupled in series to the first I/O pad 362. The nominal resistance of external resistance $r_{ext}$ 358 is typically defined by a designer of the integrated circuit 302. A voltage meter 356 is coupled to measure voltage $V_{MEAS}$ between the first I/O pad 362 and a second I/O pad 372 of the integrated circuit 302. Alternatively, the external voltage $V_{BIN}$ 354 in series with resistance $r_{ext}$ 358 can be replaced by an external current source $I_{BIN}$ (not shown) with resistance $r_{ext}$ in parallel (Norton equivalent).

Now, the integrated circuit 302 is described. A bipolar transistor 325 has a base 322 with a base parasitic resistance $r_B$ 320, a collector 326 with a collector parasitic resistance $r_C$ 324, and an emitter 328 with an emitter parasitic resistance $r_E$ 329. The parasitic resistances $r_B$ 320, $r_C$ 324, $r_E$ 329 of the bipolar transistor 325 typically include the routing resistance as well. A first I/O pad 362 of the integrated circuit 302 has a resistance $r_{t1}$ 345 in series with a first terminal 341 of a switch 340. A second terminal 343 of the switch 340 is coupled to the base 322 of the bipolar transistor 325. This switch 340 is used to carry out the pad leakage current cancellation as described further below. The switch 340 has two or more resistances that can be selectively coupled in series with the resistance $r_{t1}$ 345 and the base 322 of bipolar transistor 325. In this example, the first resistance 342 is a shunt with substantially zero resistance. The second resistance 344 has a resistance $r_{SW}$. In this example, two resistance values 342, 344 are shown. In other examples, two or more resistance values may be selectively coupled in series with the resistance $r_{t1}$ 345 and the base 322 of bipolar transistor 325. The resistance $r_{t1}$ 345, the resistance $r_{t2}$ 346, the resistance $r_{GRD}$ 348, represent the routing and connectivity resistances. The resistances $r_{t1}$, $r_{t2}$ and $r_{GRD}$ represent routing resistances, transmission gate resistances and wirebonding resistances, i.e., all un-desired resistances that may appear on the signal path. These are also known as parasitic or undesirable resistances.

A driver 315 is shown coupled with an input 316 coupled to the collector 326 of the bipolar transistor 325. The output 317 of the driver 315 is coupled to the collector 322 of the bipolar transistor 325. A selectable-gain current mirror circuit 310 with a control input gs 312 that is used to select a current mirror gain $N_{gs}$ 316 is coupled to the collector 326. The selectable-gain current mirror circuit 310 includes an internal current source with a current output $I_{BIAS}$ 318. The current output $I_{BIAS}$ 318 is coupled in series with a resistance $r_{GND}$ 346 to the third I/O pad 382 of integrated circuit 302. This selectable-gain current mirror circuit 310 provides for precise control of biasing current ratios. A skilled designer may replace the selectable-gain current mirror by some other implementation that supports precise control of the biasing current ratios which includes the alternative of providing the biasing currents through an I/O pad (not shown).

Zero or more bipolar transistors 335 are coupled in series between the emitter 328 of bipolar transistor 325 and the resistance $r_{GND}$ 347 and resistance $r_{t2}$ 346. Each of the bipolar transistors 335 has a base 332 with a base resistance $r_B$ 330, a collector 336 with a collector resistance $r_C$ 334, and an emitter 338 with an emitter resistance $r_E$ 339. Each of the bipolar transistors 335 can be realized as a diode. The base 332 and collector 336 of each of the bipolar transistors 335 are coupled together to form the diode. These diodes are placed in a cascaded series configuration to produce the temperature-related voltages with adequate excursion and thermal sensitivity. Transistors 335 and 325 can be made identical in order to conduct an equal collector current.

Procedure to Extract Die Temperature

The die temperature extraction method with cancellation of pad leakage current effect using the die temperature sensor measurement system 300 of FIG. 3 is now described. The bipolar transistors (shown as transistors 325 and 335) are sequentially biased with a set of proportional collector current levels. For each bias condition, the temperature-dependent voltage produced by the structure is measured and stored. Die temperature is obtained through algebraic manipulation of these temperature-dependent voltage values.

Each voltage value can be obtained through a sequence of measurements that rely on test instrumentation and a switched-resistance connection arrangement 340 between voltage meter $V_{MEAS}$ 356 and output pads 362, 372. The effects of bipolar terminal parasitic resistances ($r_B$ 320 $r_C$ 324 $r_E$ 326 of the bipolar transistors 325 and 335) and pad leakage current are canceled as described hereinbelow. Finally, the non-ideality factor of the technology can be taken into account to achieve maximum accuracy.

Figure 4:
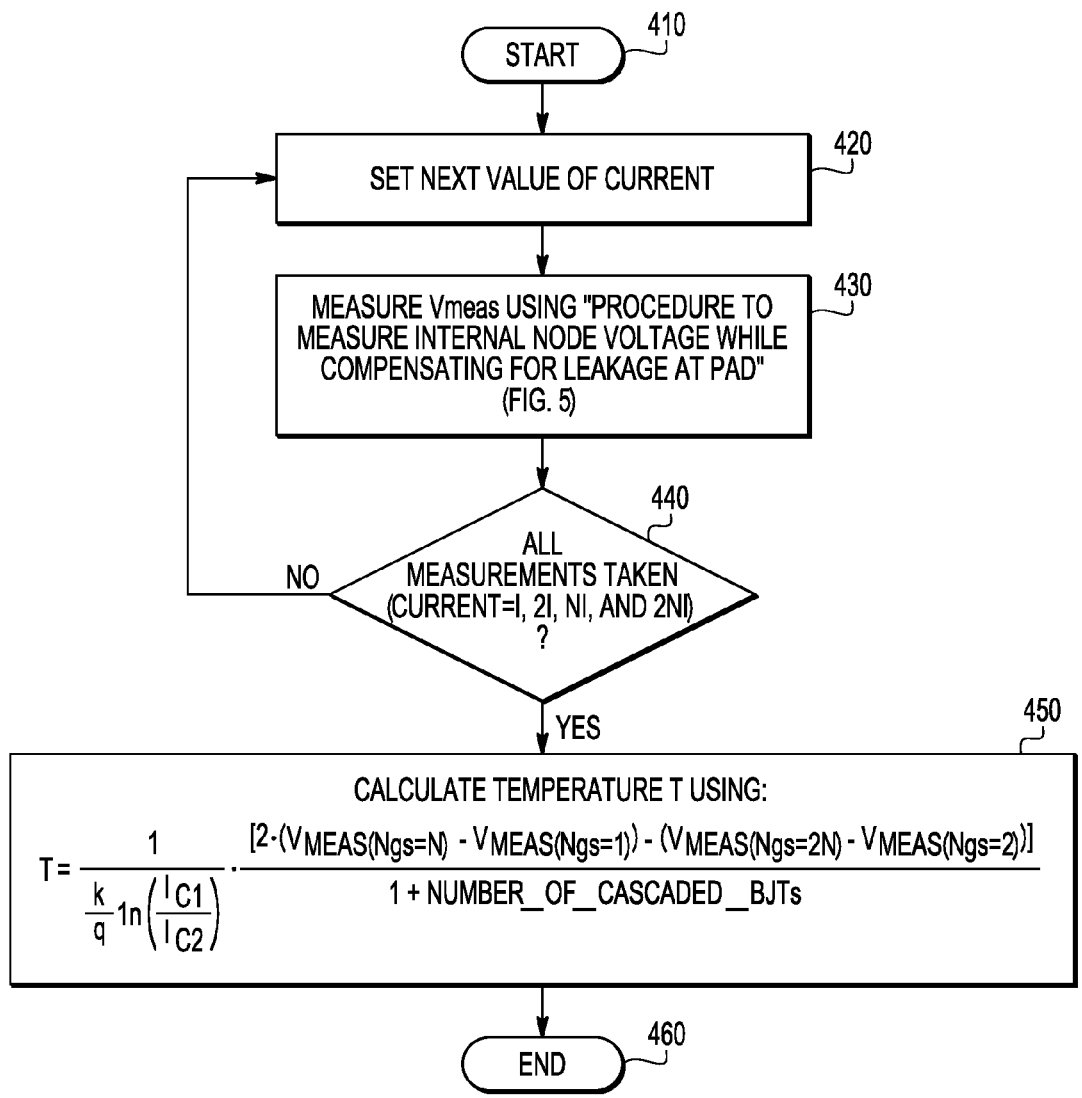
FIG. 4 is a flow diagram of an embodiment of a procedure to extract die temperature to the circuit in FIG. 3.

FIG. 4 is a flow diagram of a procedure to extract die temperature to the circuit in FIG. 3. The process begins at step 410 and immediately proceeds to an iterative loop starting in step 420. A next value of current from the selectable-gain current mirror 310 is set to flow through the bipolar transistors 325 and 335. The value of the current in one example is a sequence I, 2I (twice I), NI (where N is an integer higher than 2), 2NI (where 2N is twice N). The values of the extreme values, I and 2NI, are selected such that β=Ic/Ib current gain variation is negligible. The common-emitter current gain is represented by β or $β_F$ or $h_{FE}$, and is approximately the ratio of the DC collector current to the DC base current in forward-active region. In step 430, the measured voltage $V_{MEAS}$ is obtained. The details of step 430 are further described in FIG. 5 below. In step 440, a determination is made whether measured voltage $V_{MEAS}$ has been recorded for each current in the set. In this example, there are at least four (4) values of current: I, 2I, NI and 2NI. If the measured voltage $V_{MEAS}$ has not been recorded for all of the values of current in the set, the process returns to step 420. Otherwise, once all the measured voltages $V_{MEAS}$ have been recorded for all of the current values in the current set, the process continues to step 450.

Using the measurements from step 430 the terminal resistance effect can be canceled. Specifically, the measured voltage $V_{MEAS}$, i.e., $V_{BE}$ for $I_C$=I, 2I, NI and 2NI are written as:

$$(a)\ V_{B'E'1} = r_b \frac{I_{BIAS}}{\beta} + r_e\left(\frac{\beta+1}{\beta}\right)I_{BIAS} + \frac{k}{q}\ln\left(\frac{I_{BIAS}}{I_S}\right)\cdot T;\quad \text{(Equations 2)}$$

$$(b)\ V_{B'E'2} = r_b \frac{2I_{BIAS}}{\beta} + r_e 2\left(\frac{\beta+1}{\beta}\right)I_{BIAS} + \frac{k}{q}\ln\left(\frac{2I_{BIAS}}{I_S}\right)\cdot T;$$

$$(c)\ V_{B'E'N} = r_b \frac{NI_{BIAS}}{\beta} + R_e N\left(\frac{\beta+1}{\beta}\right)I_{BIAS} + \frac{k}{q}\ln\left(\frac{NI_{BIAS}}{I_S}\right)\cdot T;$$

$$(d)\ V_{B'E'2N} = r_b \frac{2NI_{BIAS}}{\beta} + r_e 2N\left(\frac{\beta+1}{\beta}\right)I_{BIAS} + \frac{k}{q}\ln\left(\frac{2NI_{BIAS}}{I_S}\right)\cdot T$$

By combining the expressions above (Equations 2) in the form 2*(c−a)−(d−b), the terms $r_B$ and $r_C$ cancel, which represent the effect of the terminal resistances.

$$2(V_{B'E'N} - V_{B'E'1}) + V_{B'E'2N} - V_{B'E'2} = \quad \text{(Equation 3)}$$

$$\left(r_b \frac{I_{BIAS}}{\beta} + r_e\left(\frac{\beta+1}{\beta}\right)\right)\cdot(2N-2-2N+2) +$$

$$\frac{k}{q}T\left(2\ln\left(\frac{NI_{BIAS}}{I_S}\right) - 2\ln\left(\frac{I_{BIAS}}{I_S}\right) - \ln\left(\frac{2NI_{BIAS}}{I_S}\right) + \ln\left(\frac{2I_{BIAS}}{I_S}\right)\right) \Rightarrow$$

$$2(V_{B'E'N} - V_{B'E'1}) + V_{B'E'2N} - V_{B'E'2} =$$

$$\frac{k}{q}\ln(N)\cdot T \Rightarrow T =$$

$$\frac{1}{\frac{k}{q}\ln(N)} \cdot (2(V_{B'E'N} - V_{B'E'1}) + V_{B'E'2N} - V_{B'E'2})$$

Therefore, to cancel the effect of the terminal resistances (i.e., $r_B$ and $r_C$) and alternatively adding more BJTs in series to increase sensitivity, Equation 3 can be re-written as:

$$T = \frac{1}{\frac{k}{q}\ln(N)} \times \frac{\begin{array}{l}2\cdot(V_{MEAS(Ngs=N)} - V_{MEAS(Ngs=1)}) - \\ (V_{MEAS(Ngs=2N)} - V_{MEAS(Ngs=2)})\end{array}}{1 + \text{Number\_of\_Additional\_Cascaded\_BJTs}} \quad \text{(Equation 4)}$$

where $V_{MEAS(Ngs=N)}$ is the measured voltage between the first I/O pad 362 and the second I/O pad 372 with an N value selected as the current mirror gain. The term $N_{gs}$ 316 is the current gain through which one collector current is selected from the set of currents I, 2I, NI and 2NI provided by the selectable gain current mirror 310. Boltzmann's constant is k, and q is the electron charge. T is the absolute temperature measured in kelvin. The term ln is the natural logarithm function, I is the collector current at the first time interval, 2I is the collector current at the second time interval, NI is the collector current at the third time interval, and 2NI is the collector current at the fourth time interval. The term Number_of_Additional_Cascaded_BJTs is the integer number of the optional cascaded series configuration 335. After the temperature is calculated in step 450 the process ends in step 460.

Procedure to Compensate for Pad Leakage

Figure 5:
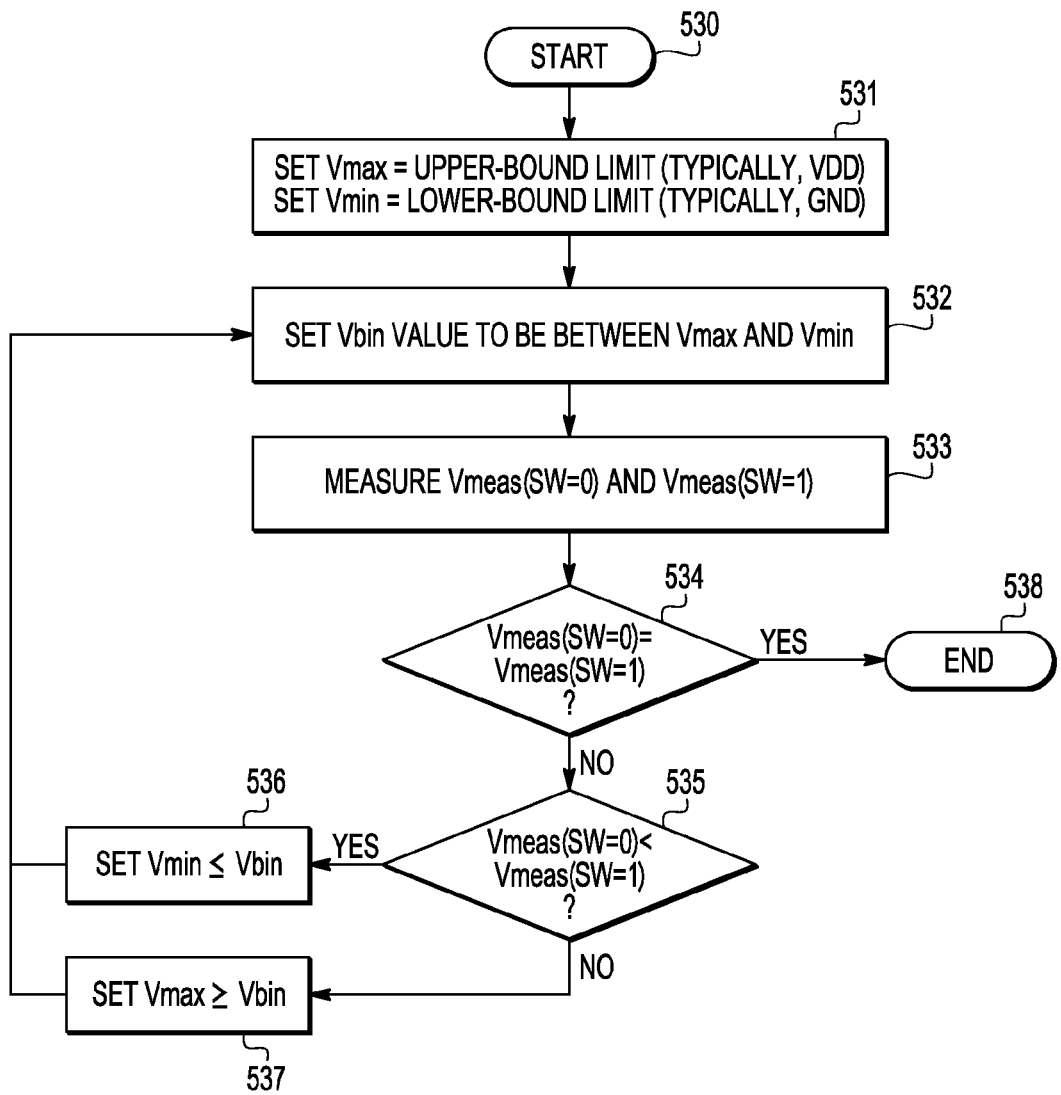
FIG. 5 is a flow diagram of an embodiment of a procedure in FIG. 4 to compensate for leakage at the pad.

FIG. 5 is a flow diagram of a procedure in FIG. 4 to compensate for leakage at the pad. The process begins in step 530 and immediately proceeds to step 531 in which an upper bound voltage $V_{MAX}$ is set. Typically, the upper bound voltage $V_{MAX}$ is set to the positive supply voltage which is also referred to as $V_{DD}$. Also in step 531, a lower bound voltage is set, typically to ground or zero. The process continues to step 532 in which an iterative loop is entered where the external voltage $V_{BIN}$ 354 is set to a value between $V_{MAX}$ and $V_{MIN}$. In one example, the value is set to:

$$V_{BIN} = \frac{V_{MAX} - V_{MIN}}{2} \quad \text{(Equation 5)}$$

In step 533, at least two voltage measurements $V_{MEAS}$ are taken. The first voltage measurement $V_{MEAS(SW=0)}$ is measured when the switch 340 is in a first position (SW=0) with a resistance $r_{SW}$ 344. The second voltage measurement $V_{MEAS(SW=1)}$ is measured when the switch 340 is in a second position (SW=1). This second position may be a shunt with substantially zero resistance. A test in step 534 is made to determine if $V_{MEAS(SW=0)}$ is equal to $V_{MEAS(SW=1)}$. If the measured voltages are equal the process ends in step 538. Otherwise, if the measured voltages are different, a second test is made in step 535. If $V_{MEAS(SW=1)}$ is greater than $V_{MEAS(SW=0)}$ the process continues to step 536 to set $V_{MIN} \leq V_{BIN}$ and then loops back to step 532. Otherwise, if $V_{MEAS(SW=1)}$ is less than or equal to $V_{MEAS(SW=0)}$, the process continues to step 537 to set $V_{MAX} \geq V_{BIN}$ and then loops back to step 532.

Figure 6:
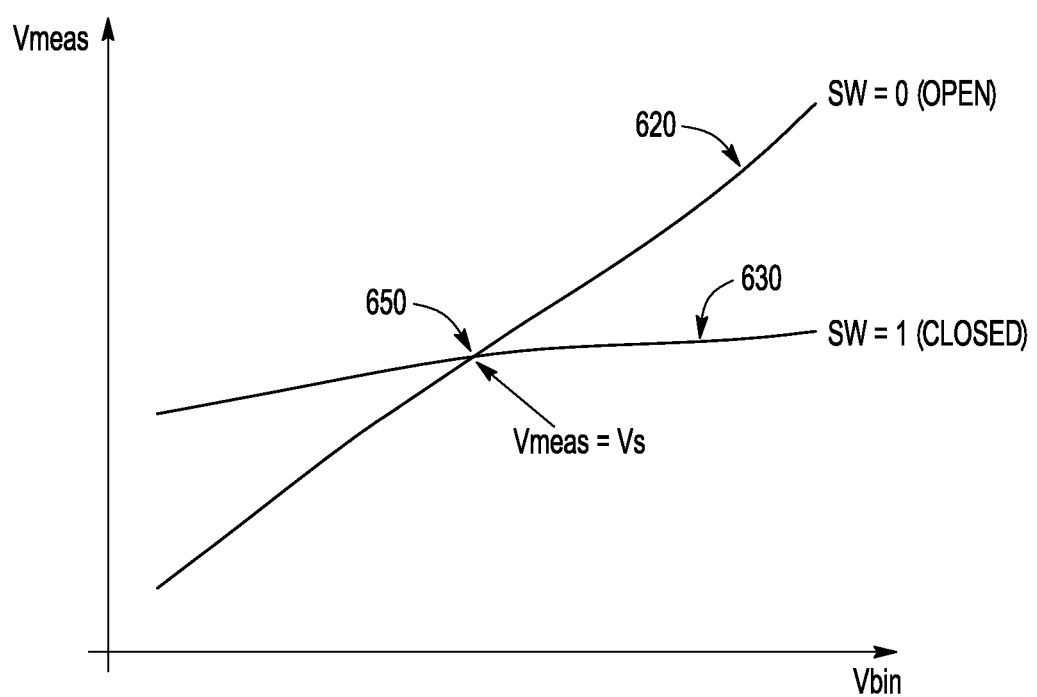
FIG. 6 is a plot of an example of the measured voltage versus the applied voltage to determine a value of the applied voltage.

FIG. 6 is a plot corresponding to the measured voltage $V_{MEAS}$ versus the applied voltage $V_{BIN}$ for SW=0 and SW=1. Note that a nonlinear characteristic of $V_{MEAS}(V_{BIN})$ derives from the nonlinear characteristic of the pad leakage current. Also note the line 620 (SW=0) and the line 630 (SW=1) have different slopes and intersect when $V_{MEAS}$ equals the node voltage of interest, also known as $V_S$ 650. When $V_{MEAS}$ is not equal to $V_S$, there is a non-zero current flowing through the path that connects the nodes $V_{MEAS}$ and $V_S$. In this case, the $V_{MEAS}$ voltage value changes when a state of the switch 340 is toggled because the magnitude of the current between nodes $V_{MEAS}$ and $V_S$ changes in response to a change of the path resistance between these nodes. When the voltages at nodes $V_{MEAS}$ and $V_S$ are equal, there is no current through the path that connects these nodes regardless of the state of the switch 340 and therefore the voltage value at node $V_{MEAS}$ is not affected by a toggle on the state of the switch 340 (intersect point in FIG. 6). In this case, all I/O pad leakage current is provided by the external source (no current flowing from or into the node of interest) and the voltage measured $V_{MEAS}$ equals the voltage of interest $V_S$.

For a unique value of externally forced voltage $V_{BIN}$, all I/O pad leakage current is drained/sourced by the external supply; therefore, no current flows through the resistive path between the pad and internal signal node. For this condition, the measured voltage $V_{MEAS}$ at the I/O pads 362, 372 are equal to the voltage of interest ($V_{MEAS}=V_S$), i.e., the pad leakage current effect is canceled. In one example, the optimum voltage $V_{BIN}$ to be forced is obtained through an iterative procedure (voltage weep or binary search). At each iteration, the serial resistance between the pad 220 and the internal signal node is changed (using a switched-resistance arrangement 340) and the voltage measurements $V_{MEAS}$ that are derived are compared. $V_{BIN}$ is set higher if $V_{MEAS(SW=1)} > V_{MEAS(SW=0)}$ and set lower otherwise, until no change is detected.

There are circumstances when an iterative process to cancel pad leakage is not desirable because it causes a longer time to achieve leakage cancelation. In such circumstances, the following procedure is used: A first $V_1$ voltage is applied to $V_{BIN}$ while a first $V_{MEAS}$ is acquired ($V_{M1}$), the switch 340 is then closed and a new $V_{MEAS}$ is acquired ($V_{M2}$). A new $V_2$ voltage is then applied to $V_{BIN}$, and the procedure is repeated resulting in voltages $V_{M3}$ and $V_{M4}$. Assuming that the internal resistances and leakage currents remain reasonably constant over a range of the voltage of interest, then the voltage of interest $V_S$ is approximated by:

$$V_S = \left[ \frac{V_{M2} - V_{M1}}{(V_{M4} - V_{M3}) + (V_{M2} - V_{M1})} \right](V_2 - V_1) + V_1 \quad \text{(Equation 6)}$$

This method can also be used in an iterative fashion resulting in a much faster convergence than other iterative methods and also relaxing the assumptions made previously.

Note that the adequate values of resistance can be chosen to relax forcing precision requirements of $V_{BIN}$ while maintaining fast settling characteristic. Precision of measurement of $V_S$ can be limited by voltmeter precision on measuring $V_{MEAS}$. The resistance $r_{SW}$ 344 can also be removed (switch's on and off resistance changes only) if $r_{EXT}$ 358 is low enough for fast settling. Also note that $V_{BIN}$ and $r_{EXT}$ 358 can be replaced by a Norton equivalent if the use of an external current source is more convenient.

Non-Ideality Factor

For high-precision products, one needs to consider that $\Delta V_{BE}$ actually shows a weak dependence with process technology. This dependence is captured by the non-ideality factor n (or forward emission coefficient) extracted for the technology which is known to show negligible variance between samples obtained from a single process. The more accurate expression for $\Delta V_{BE}$ is:

$$\Delta V_{BE} = V_{BE1} - V_{BE2} = n \cdot \frac{k}{q} \ln\left(\frac{I_{C1}}{I_{C2}}\right) \cdot T \quad \text{(Equation 7)}$$

The non-ideality factor n should be extracted for each specific technology in order to guarantee maximum accuracy (n is typically equal to "1"). However, the parameter is known to show negligible variation over samples from a same technology so it is sufficient to extract it once as a technology constant. This is common-practice among high-precision temperature sensors from the market that exploit thermal properties of bipolar transistors.

Embodiments of circuits and methods disclosed herein measure die temperature with very high precision during factory test. Highly accurate current-mirrors provide precise control of biasing current ratios. The use of a switched-resistance scheme supports pad leakage current cancellation. Embodiments disclosed herein can include cascading devices for optimum coupling with test instrumentation. Therefore, die temperature is extracted during factory-test with higher accuracy and over a wider temperature range.

The specification and figures are to be regarded in an illustrative rather than a restrictive sense, and all such modifications are intended to be included within the scope of the present disclosure. Any benefits, advantages or solutions to problems described herein with regard to specific embodiments are not intended to be construed as a critical, required or essential feature or element of any or all the claims. Unless stated otherwise, terms such as "first" and "second" are used to arbitrarily distinguish between the elements such terms describe. Thus, these terms are not necessarily intended to indicate temporal or other prioritization of such elements. Note that the term "couple" has been used to denote that one or more additional elements may be interposed between two elements that are coupled.

Although the invention is described herein with reference to specific embodiments, various modifications and changes can be made without departing from the scope of the present invention as set forth in the claims below.

What is claimed is:

1. A method to measure temperature in a temperature sensing circuit, the method comprising:
   1) coupling together the temperature sensing circuit including at least one bipolar transistor and a current mirror with a gain, and a programmable current-mirror output coupled to a collector of the bipolar transistor;
   2) setting the gain of the current mirror to a first value from a set of current gain values;
   3) measuring an output signal produced by the temperature sensing circuit by a) setting a voltage magnitude of an input voltage between a first I/O pad and a third I/O pad of the temperature sensing circuit,
b) changing a switchable-resistance between at least a first resistance value and a second resistance value, the switchable-resistance disposed between the first I/O pad of the temperature sensing circuit and a base of the bipolar transistor,
c) measuring, between the first I/O pad and a second I/O pad of the temperature sensing circuit, the output signal in response to the input voltage, and
increasing the voltage magnitude of the input voltage, and repeating steps a through c, in response to the output signal being measured with the second resistance applied being greater than the output signal being measured with the first resistance applied, decreasing the voltage magnitude of the input voltage, and repeating steps a through c, in response to the output signal being measured with the second resistance applied being less than the output signal being measured with the first resistance applied;
repeating steps 2 through 3 until at least each of the current gain values has been used to set the gain of the current mirror and the output signal measured; and
4) calculating a temperature produced by the temperature sensing circuit by using each output signal that has been measured for each of the set of current gain values used to set the gain of the current mirror.

2. The method of claim 1, wherein the increasing the voltage magnitude of the input voltage includes decreasing a maximum voltage down to a last value tested of the input voltage and repeating steps a through c.

3. The method of claim 2, wherein the magnitude of the maximum voltage is up to the magnitude of a positive supply voltage.

4. The method of claim 1, wherein the coupling together a temperature sensing circuit includes at least one additional bipolar transistor coupled in series between an emitter of the bipolar transistor and the second I/O pad.

5. The method of claim 4, wherein the at least one additional bipolar transistor is coupled to form a diode.

6. The method of claim 4, wherein the calculating a temperature produced by the temperature sensing circuit by using each output signal that has been measured includes calculating the temperature T in kelvin by $$T = \frac{1}{\frac{k}{q}\ln\left(\frac{I_{C1}}{I_{C2}}\right)} \times \frac{\begin{bmatrix} 2 \cdot (V_{MEAS(Ngs=N)} - V_{MEAS(Ngs=1)}) - \\ (V_{MEAS(Ngs=2N)} - V_{MEAS(Ngs=2)}) \end{bmatrix}}{1 + \text{Number\_of\_Additional\_Cascaded\_BJTs}}$$

where $V_{MEAS(Ngs=N)}$ is a measured voltage between first I/O pad and second I/O pad to an integrated circuit with a current gain $N_{gs}$ through which one collector current is selected from the set of current gain values I, 2I, NI and 2NI provided by the current mirror, k is a Boltzmann's constant, q is an electron charge, ln is a natural logarithm function, I is a collector current at a first time interval, 2I is a collector current at a second time interval, NI is a collector current at a third time interval, and 2NI is a collector current at a fourth time interval and Number_of_Additional_Cascaded_BJTs is an integer number of the additional bipolar transistors.

7. The method of claim 1, further comprising:
increasing a minimum voltage up to a last value tested of the input voltage, and repeating steps a through c, in response to the output signal being measured with the second resistance applied being greater than the output signal being measured with the first resistance applied.

8. The method of claim 7, wherein the magnitude of the minimum voltage is down to a ground voltage.

9. The method of claim 8, wherein a negative supply voltage is set to a ground potential.

10. The method of claim 1, wherein the coupling together a temperature sensing circuit includes at least one driver with an input coupled to a collector of the bipolar transistor and an output coupled to a base of the bipolar transistor.

11. The method of claim 10, wherein the coupling together a temperature sensing circuit includes at least one additional bipolar transistor coupled in series between an emitter of the bipolar transistor and the second I/O pad.

12. The method of claim 11, wherein the at least one additional bipolar transistor is coupled to form a diode.

* * * * *